(12) United States Patent
Baiza et al.

(10) Patent No.: US 7,967,399 B1
(45) Date of Patent: Jun. 28, 2011

(54) LINEARLY ACTUATED CHASSIS LOCK FOR A DRAWER SLIDE

(75) Inventors: Julian S. Baiza, Arlington, TX (US);
Yueming Xu, Singapore (SG);
Wenming Yang, Singapore (SG)

(73) Assignee: Central Industrial Supply Company, Tuscon, AZ (US)

( * ) Notice: Subject to any disclaimer, the term of this patent is extended or adjusted under 35 U.S.C. 154(b) by 799 days.

(21) Appl. No.: 11/903,420

(22) Filed: Sep. 21, 2007

(51) Int. Cl.
*A47B 88/00* (2006.01)

(52) U.S. Cl. .................................. 312/223.1; 312/334.8

(58) Field of Classification Search .................. 312/333, 312/334.44–334.47, 334.1, 334.8, 319.1, 312/223.1, 265.1–265.4; 384/20–22; 211/26
See application file for complete search history.

(56) References Cited

U.S. PATENT DOCUMENTS

| | | | |
|---|---|---|---|
| 516,583 A | 3/1894 | Adkins | |
| 567,693 A | 9/1896 | Smith | |
| 2,566,064 A | 8/1951 | Keim | |
| 2,862,772 A | 12/1958 | Gussack | |
| 4,423,914 A | 1/1984 | Vander Ley | |
| 4,473,262 A | 9/1984 | Staye | |
| 4,838,627 A | 6/1989 | Macias | |
| 5,439,284 A | 8/1995 | Grabher | |
| 5,599,080 A | 2/1997 | Ho | |
| 5,632,542 A | 5/1997 | Krivec | |
| 5,683,159 A | 11/1997 | Johnson | |
| 6,123,314 A * | 9/2000 | Steele | 248/681 |
| 6,209,979 B1 | 4/2001 | Fall et al. | |
| 6,601,933 B1 | 8/2003 | Greenwald | |
| 6,626,300 B2 | 9/2003 | Kaminski et al. | |
| 6,930,887 B2 | 8/2005 | Hartman | |
| 6,938,967 B2 * | 9/2005 | Dubon et al. | 312/333 |
| 7,481,504 B2 * | 1/2009 | Chen et al. | 312/333 |
| 7,513,581 B1 * | 4/2009 | Baiza et al. | 312/333 |
| 7,661,778 B2 * | 2/2010 | Yang et al. | 312/333 |
| 2004/0108797 A1 * | 6/2004 | Chen et al. | 312/334.7 |
| 2005/0206284 A1 * | 9/2005 | Dubon et al. | 312/333 |
| 2005/0248247 A1 * | 11/2005 | Huang | 312/334.47 |
| 2007/0018547 A1 | 1/2007 | Yang et al. | |
| 2007/0114895 A1 | 5/2007 | Chen et al. | |

* cited by examiner

*Primary Examiner* — Janet M Wilkens
(74) *Attorney, Agent, or Firm* — Mark W Handley

(57) ABSTRACT

A drawer slide (12) has a moveable lock member (30) and a set of spaced apart slots (24, 26, 28) configured for receiving respective chassis mounting lugs (22). The slots (24, 28) are substantially vertical, and the slot (26) extends on one side of the slots (24, 28) and at an angle to the vertical, sloping downward and away from the slots (24, 28). The lock member (30) is linearly moveable from a closed position adjacent to the slot (24) to an open position aside of the slot (24) to selectively allow the mounting lug (22) to be removed from the slot (24). The lock member (30) includes an elongate tab (42) for slidably fitting within an elongate slot (44) in the drawer slide (12), and an elongate slot (58) through which a rivet extends to slidably secure the lock member (30) to the drawer slide (12).

20 Claims, 3 Drawing Sheets

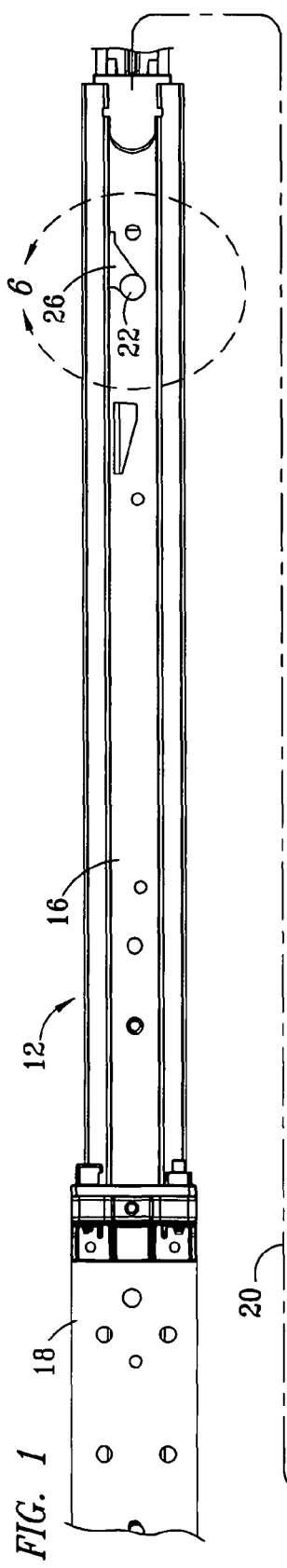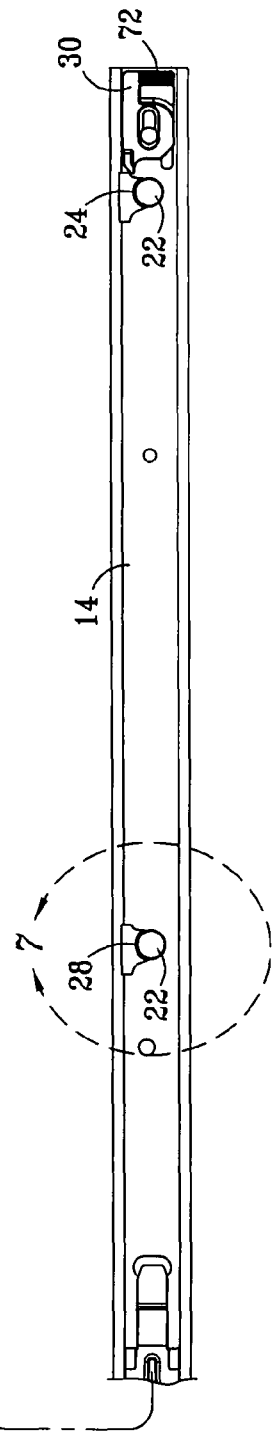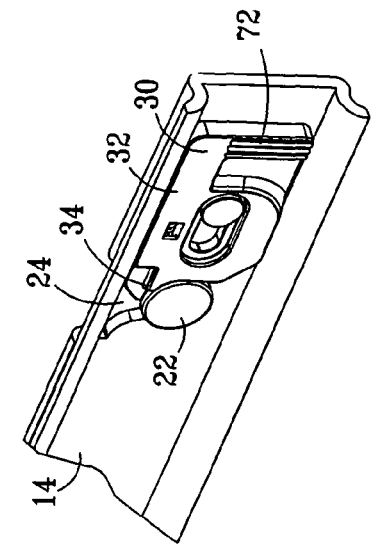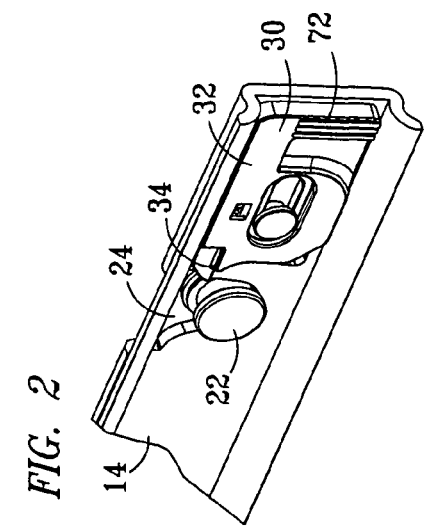
FIG. 1
FIG. 2
FIG. 3

US 7,967,399 B1

LINEARLY ACTUATED CHASSIS LOCK FOR A DRAWER SLIDE

TECHNICAL FIELD OF THE INVENTION

The present invention relates in general to drawer slides, and in particular to a lock for securing a drawer to an inner member of drawer slide.

BACKGROUND OF THE INVENTION

Drawers or chassis have been secured to drawer slides by various methods, include using threaded fasteners to secure chassis to drawer slides. Some chassis have mounting lugs which extend from the chassis for fitting within mounting slots formed in the drawer slides. Chassis locks have been provided for securing the mounting lugs within the slots to secure the chassis to the drawer slides.

SUMMARY OF THE INVENTION

A chassis lock for drawer slide is provided by forming a set of mounting slots into a first drawer slide member for receiving respective mounting lugs of a chassis and moveably securing a lock member adjacent to one of the mounting slots for moving between an open position and a closed position to determine whether a chassis mounting lug is retained within the mounting slot adjacent the lock member. The mounting slots are spaced apart, with one being disposed to slope downward and away from the other slots. The lock member is moveably secured adjacent to one of the mounting slots which is spaced apart the downwardly sloped slot. The lock member preferably has a main body portion from which a protuberance extends to define a lock tab. An upper side of the protuberance defines a cam follower surface, and a lower side of the protuberance defines a stop surface. A grip surface is provided by a set of protuberant ribs which extend in parallel from an outward side of the main body portion of the lock member. A recess is formed into an inner surface of the lock member for receiving a bias spring. The bias spring engages between the lock member and the first drawer slide member for urging the lock member into the closed position. An elongate tab extends from an inward side of the main body of the lock member to provide a guide portion which slidably fits within a horizontal guide slot formed into the first drawer slide member to locate the lock member in the open position and the closed position. An elongate slot extends in the main body portion of the lock member, parallel to the elongate slot, for receiving a fastening member which slidably secures the lock member to the first drawer slide member for moving linearly along the longitudinal axis of the drawer slide. The lock member is slidably mounted to the first drawer slide member alongside the adjacent slot, such that when the weight of a chassis is applied through the mounting lug to the cam follower surface of the lock member, the lock member is moved to the open position in which the lock member is aligned for passing the mounting lug into the adjacent slot. When in the closed position, the stop surface of the lock member prevents removal of the mounting lug from within the adjacent slot.

DESCRIPTION OF THE DRAWINGS

For a more complete understanding of the present invention and the advantages thereof, reference is now made to the following description taken in conjunction with the accompanying Drawings in which FIGS. 1 through 7 show various aspects for a drawer slide having a chassis lock with a linearly movable lock member for securing a chassis the drawer slide according to the present invention, as set forth below:

FIG. 1 is a partial side elevation view of the drawer slide and the chassis lock, with the lock member of the chassis lock disposed for passing a chassis mounting lug into an adjacent mounting slot formed into the drawer slide;

FIG. 2 is a partial perspective view of a forward end of the drawer slide, and shows the lock member of the chassis lock disposed in an open position, after being moved toward a forward end of the drawer slide;

FIG. 3 is a partial perspective view of the forward end of the drawer slide, and shows the lock member of the chassis lock disposed in a closed position, securing the chassis mounting lug to the drawer slide;

FIG. 4 is an exploded, partial perspective view of inward sides of the lock member and the forward end of the drawer slide;

FIG. 5 is an exploded, partial perspective view of outward sides of the lock member and the forward end of the drawer slide;

FIG. 6 is a partial side elevation view of the drawer slide at an intermediate portion having a rearward slot formed into an upper portion of a first slide member; and FIG. 7 is a partial side elevation view of the first slide member at an intermediate portion having an intermediate slot formed into an upper portion of the first slide member.

DETAILED DESCRIPTION OF THE INVENTION

Figure 4:
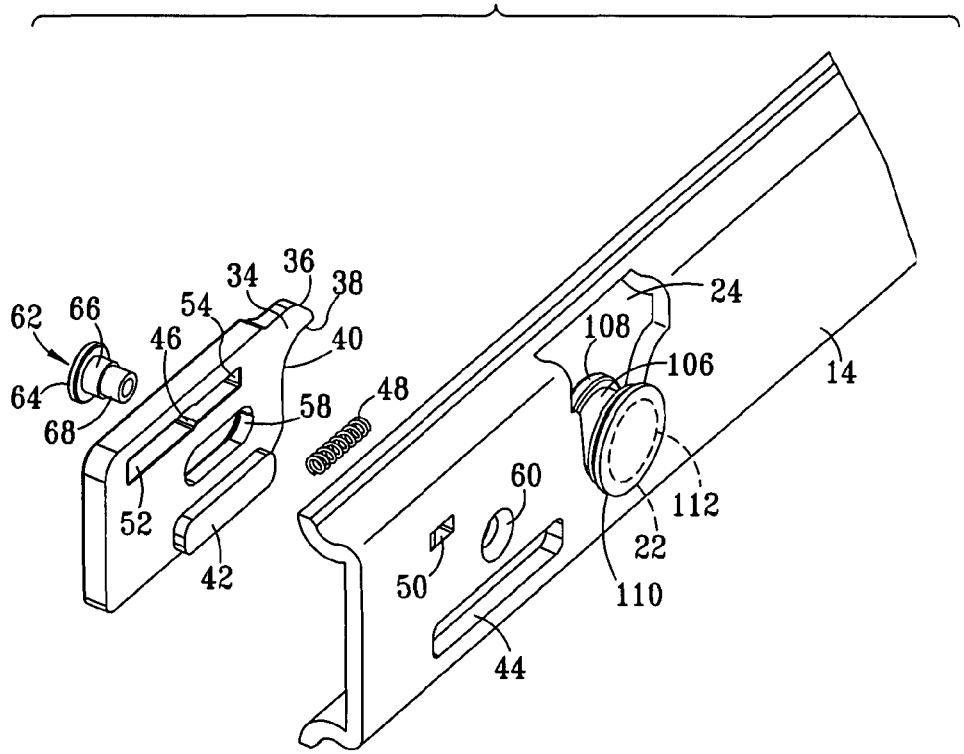

FIG. 1 is a partial side elevation view of a drawer slide 12 having a first slide member 14, a second slide member 16 and a third slide member 18. In some embodiments, the drawer slide 12 may include a different number of slide members, such as two slide members. The first slide member 14 is slidably extensible from within the second slide member 16, and the second slide member 16 is slidably extensible from within the third slide member 18 along a longitudinal axis 20 of the drawer slide 12 for supporting a chassis (not shown) in a cantilevered arrangement. The first slide member 14 is shown after moving outward from within the second slide member 16 to a fully extended position. Three mounting slots 24, 26 and 28 are provided in the sidewall of the first slide member 14, spaced apart along the length of the first slide member 14. The slots 24, 26 and 28 extend through an upper edge of the first slide member 14 into a sidewall of the first slide member 14 for receiving chassis mounting lugs 22 of a chassis (not shown). A first slot is provided by a forward slot 24 located in a forward end portion of the first slide member 14. A second slot is provided by a rearward slot 26 located in an intermediate portion the first slide member 14. A third slot is provided by an intermediate slot 28 located intermediate between the forward slot 24 and the rearward slot 26.

A chassis lock member 30 is slidably mounted adjacent to the forward slot 24, at the forward end of the first slide member 14, for moving between an open position shown in FIGS. 1 and 2, and a closed position shown in FIG. 3. When the lock member 30 is located in the open position shown in FIGS. 1 and 2, one of the mounting lugs 22 may pass into and may be withdrawn from the forward slot 24. When the lock member 30 is moved to the closed position shown in FIG. 3, the lock member 30 prevents removal of the mounting lug 30 from within the slot 24, which secures the mounting lug 22 and the forward end of the associated chassis to the first slide member 14. Securing one of mounting lugs 22 in the forward slot 24 prevents removal of a second mounting lug from within the rearward slot 26, which slopes downward in a rearward direction, away from the forward slot 24 and the intermediate slot 28. The lock member 34 is preferably normally disposed in the closed position shown in FIG. 3, and selectively moved away from the rearward slot 26 to the open position shown in FIGS. 1 and 2 by a user either manually sliding the chassis lock member 30 to a forward position relative the slide member 14, or applying the weight of the chassis associated with the mounting lug 22 to the lock member 30 while inserting the mounting lug into the forward slot 24.

FIGS. 2 and 3 are is a partial perspective view of the forward end of the first slide member 14, and show one of the chassis mounting lugs 22 disposed within the forward slot 24. FIG. 2 shows the lock member 30 disposed in an open position to allow passage of the chassis mounting lug 22 into the forward slot 24, and FIG. 3 shows the lock member 30 disposed in a closed position for retaining the mounting lug 22 within the slot 24. The lock member is linearly moved from the open position, shown in FIG. 2 to the closed position, shown in FIG. 3, along a linear path which in the preferred embodiment extends parallel to the longitudinal axis 20 of the drawer slide 12, which is horizontal. The lock member 30 has a main body portion 32 and a rearwardly extending protuberance 34 which preferably extends as a finger-like projection from an upper portion of the rearward end of the main body portion 32, defining a lock tab for selectively securing the mounting lug 22 within the forward slot 24. When the lock member 30 is disposed in the closed position, the protuberance 34 extends adjacent a portion of the forward slot 24 and prevents the mounting lug 22 from being removed from within the forward slot 24. When the lock member 30 is disposed in the open position, which in the embodiment shown is forward of the closed position, the protuberance is removed from extending adjacent the forward slot 24 to being disposed aside of the slot 24, such that the mounting member 22 may be removed from and may be moved into the forward slot 24.

Figure 5:
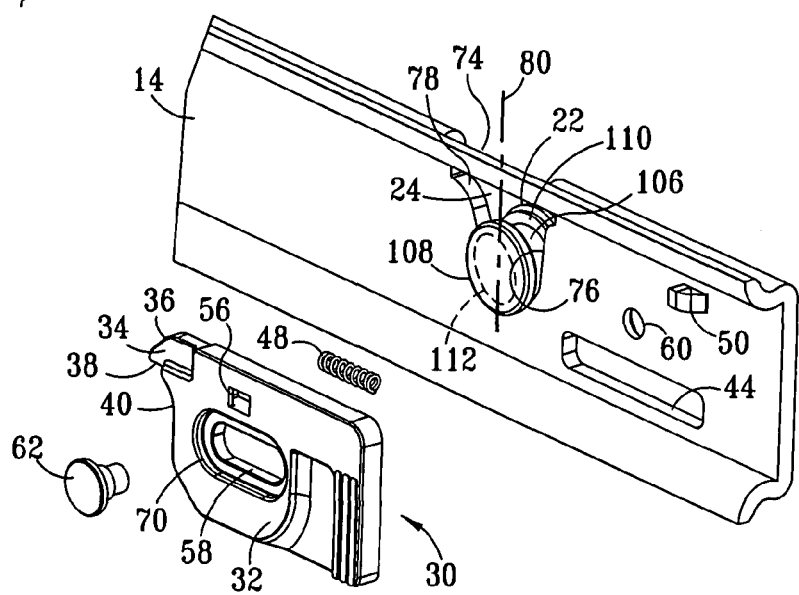

FIGS. 4 and 5 are exploded, partial perspective views of opposite sides of the forward end of the first slide member 14 and the chassis lock 30, with FIG. 4 showing inward sides of the first slide member 14 and the chassis lock 30 and FIG. 5 showing outward sides of the first slide member 14 and the chassis lock 30. The chassis mounting lug 22 is shown disposed fully within the forward slot 24. The protuberance 34 has an upper side which provides a cam follower surface 36 and a lower side which provides a stop, or lock surface 38. The cam follower surface 36 is at an angle to the vertical, such as forty-five degrees, such that the weight of a chassis applied to the follower surface 36 will push the chassis lock 30 from the closed position into a direction away from the rearward slot 26, in a forward direction in the preferred embodiment, and to an open position aside of the slot 24 to allow the mounting lug 22 to enter the forward slot 24. When the lock member 30 is in the closed position, the lock surface 38 preferably extends parallel to the longitudinal axis 20, which is horizontal, for engaging the mounting lug 22 when disposed within the forward slot 24 and prevents removal of the mounting lug 22 from the slot 24 until a user manually moves the chassis lock 30 in a forward direction to move the protuberance 34 aside of the forward slot 24 and the mounting lug 22.

The main body 32 of the chassis lock member 30 has an arcuately shaped, recessed edge 40 adjacent to the lock surface 38 of the protuberant member 34 for fitting adjacent the mounting lug 22. An elongate tab 42 extends from an inward side of the main body 32 of the lock member 30 to define a guide portion with engages with a guide section of the first slide member 14. The guide section of the first slide member is defined by an elongate slot 44 formed into a sidewall of the first slide member 14. The elongate tab 42 inter-fits within the elongate slot 44 for guiding the lock member 30 to move linearly relative to the first slide member 14. The elongate slot 44 is longer than the elongate tab 42, with both having longitudinal lengths which preferably extend parallel to the longitudinal axis 20. The respective lengths of the elongate tab 42 and the elongate slot 44 are preferably selected for locating the lock member 30 in the open position, disposed adjacent the slot 24, and the closed position, disposed aside of the slot 24.

A recess 46 is formed into an upper portion of the inward side of the main body 32 of the chassis lock member 32 for receiving a bias spring 48. The bias spring 50 is preferably provided by a coiled wire spring, which provides a biasing force under compression to urge the chassis lock 30 to move to the closed position, shown in FIG. 3. A lance tab 50 extends outward from the sidewall of the first slide member 14 for fitting within the recess 46 and engaging a forward end of the bias spring 50. The recess 46 has a forward portion 52 and a rearward portion 54, with the forward portion 52 being of a size for receiving the lance tab 50 and the rearward portion 56 being of a size for receiving the bias spring 48. In the preferred embodiment, the lance tab 50 is of a larger vertical width that the outer diameter of the bias spring 48, such that the width of the rearward portion 56 of the recess 46 is smaller than the width of the forward portion 54. The interface between the rearward portion 56 and the forward portion 54 defines as stop shoulder, which engages the lance tab 50 to also locate the chassis lock in the open position when the chassis lock member 30 is pushed from the closed position to the open position. A window 56 extends from an outward side of the main body 32 of the lock member 30 and into the recess 46.

A rivet 62 is provided for securing within a mounting hole 60 formed in the forward portion of the first slide member 14, and slidably secures the lock member 30 to the forward end of first slide member 14. The rivet 62 has a head 64 and a shank defined by a bearing portion 66 and a rivet end portion 68. The head 64 preferably has a circumferential edge periphery which is round. The head 64 is preferably larger than the width of the elongate slot 58, and the bearing portion 66 is smaller than the width of the elongate slot 58. The bearing portion 66 has a larger diameter than the rivet end 68 and the mounting hole 60 in the first slide member 14. The rivet end 68, prior to riveting, has a smaller diameter than the mounting hole 60, and is sized for fitting into and securing within the mounting hole 60, such that an edge of the bearing portion 66 adjacent to the rivet end 68 engages the sidewall of the first slide member 14 to provide a clearance between the sidewall of the first slide member 14 and the head 64 of the rivet 62. Preferably, the length of the bearing portion 66 defines a clearance between the sidewall of the first slide member 14 and the head 64 which is larger than the thickness of the lock member 30 at the elongate slot 58, such that the lock member 30 is freely slidable upon the bearing portion 66 in a linear direction, preferably parallel to the drawer slide longitudinal axis 20 (shown in FIG. 1). The elongate slot 58 has a countersunk surface 70 on an outward side thereof which is of a thickness for fully receiving the head 64 of the rivet 62. A grip surface 72 is provided by a plurality of protuberant ribs which extend in parallel, outward from the outward side of the lock member 30.

The forward slot 24 defines a first slot having an entrance section 74, a forward edge 76 and a rearward edge 78. The entrance section 74 is located at an upper edge of the sidewall of the first slide member 14, and extends into the sidewall of the first slide member 14. The forward slot 24 preferably extends along an axis 80 which is substantially vertical, such that the forward slot 24 extends along a substantially straight line. In the preferred embodiment, the forward edge 76 is substantially vertical and the rearward edge 78 extends at an acute angle to the axis 80 for guiding one of the mounting lugs fully into the forward slot 24. The space between the forward edge 76 and the rearward edge 78 tapers from a larger width for receiving the mounting lug 22 at the upper end of the slot 24 to a smaller width at a lock section of the forward slot 24 in which the mounting lug 22 is retained within the slot 24. The chassis mounting lug 22 is shown disposed in the lock section of the forward slot 24 in FIGS. 1 through 5.

Figure 6:
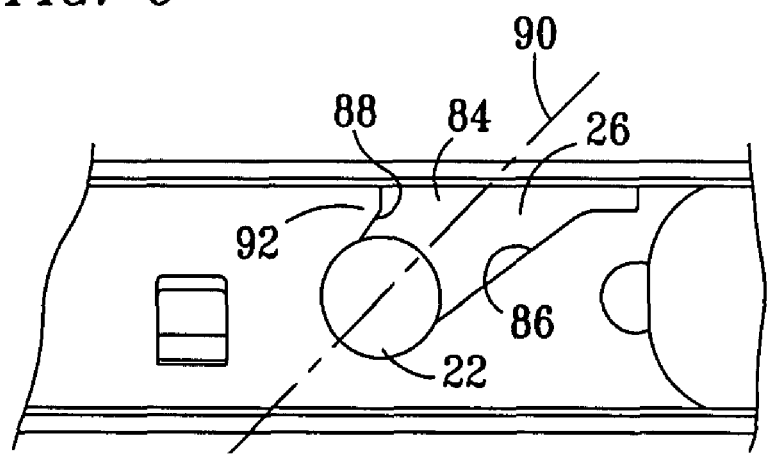

FIG. 6 is a partial, side elevation view of the intermediate section of the first slide member 14 into which the rearward slot 26 is formed to provide a second slot. The rearward slot 26 has an entrance section 84, a forward edge 86 and a rearward edge 88. The entrance section 84 is located at an upper edge of the sidewall of the first slide member 14, and extends into the sidewall of the first slide member 14. The forward edge 86 and the rearward edge 88 extend along an axis 90, such that the rearward slot 26 extends along a substantially straight line. The axis 90 extends at an angle to the vertical which is preferably approximately forty-five degrees from the longitudinal axis 20, such that when one of the chassis mounting lugs 22 is disposed fulling within in the rearward slot 26. The space between the forward edge 86 and the rearward edge 88 tapers from a larger width for receiving the mounting lug 22 at the upper end of the slot 26 to a smaller width defining a lock section for the slot 26 for retaining the mounting lug 22 within the slot 26. The chassis mounting lug 22 is shown located in the lock section of the slot 26 in FIGS. 1 and 6. The rearward edge 88 of the slot 26 defines a stop 92 which prevents the mounting lug 22 from being moved vertically when disposed fully within the slot 26. Due to the rearward and downward slope of the slot 26, the mounting lug 22 can only slide forward and upward rearward relative to the longitudinal axis 20 of the first slide member 14, and cannot be moved vertically. Preventing removal of the mounting lug 22 from within the forward slot 24 prevents forward movement of the chassis which prevents removal of the mounting lug 22 within the rearward slot 26.

Figure 7:
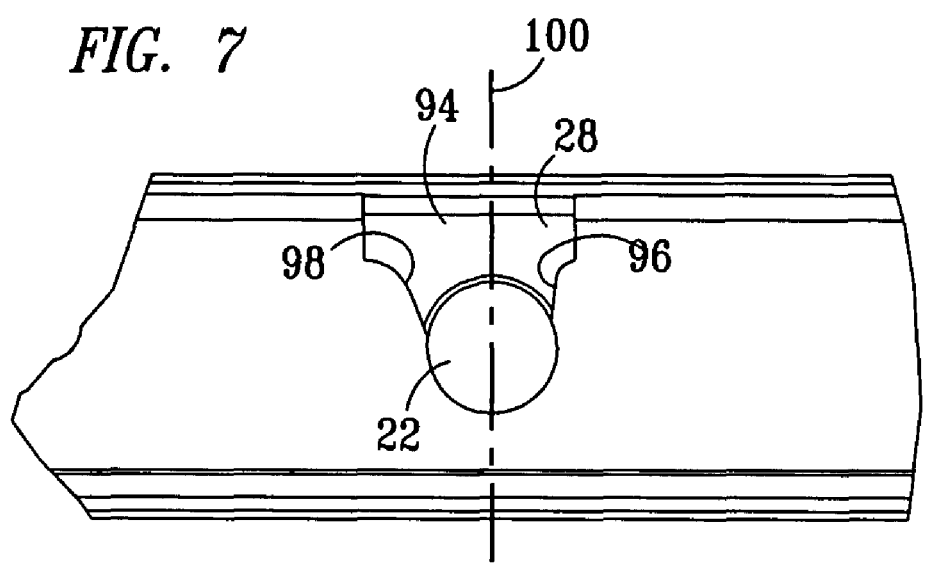

FIG. 7 is a side, elevation view of the section of the first drawer slide member 14 into which the intermediate slot 28 is formed. The intermediate slot 28 has an entrance section 94, a forward edge 96 and a rearward edge 98. The entrance section 94 is located at an upper edge of the sidewall of the first slide member 14, and extends into the sidewall of the first slide member 14. The intermediate slot 28 preferably has an axis 100 which is substantially vertical, along a straight line. The rearward edge 98 is preferably at an acute angle to the axis 100 for guiding a respective one of the mounting lugs 22 into the a position disposed fully within the intermediate slot 28. The space between the forward edge 96 and the rearward edge 98 tapers from a larger width for receiving the mounting lug 22 at the upper end of the slot 28 to a smaller width defining a lock section of the slot 28 for retaining the mounting lug 22 within the slot 28. The mounting lug 22 is shown disposed in the lock section of the slot 28 in FIGS. 1 and 7.

Referring to FIGS. 4 and 5, the chassis mounting lug 22 defines a chassis mounting member which projects from the chassis for supporting the chassis in relation to the first slide member 14 and the drawer slide 12. The chassis mounting lug 22 preferably has a head 108, a shank 106 and a boss portion 110. The head 108 is preferably of a width which is smaller than the width of the entrance section 74 of the entrance section of the forward slot 24, and larger than the width of a lower portion of the slot 24 in which the mounting lug 22 is received. The shank 106 is of a thickness which is smaller than the width of the lower portion of the slot 24, and provides a bearing portion for supporting weight of the chassis on a lower edge of the slot 24 of the first slide member 14. The mounting lug 22 may have a mounting hole 112 (shown in phantom) which extends from the boss 110, through the shank 106 and the head 108, transverse to the longitudinal axis 20, for rotatably securing the mounting lug 22 to a chassis. In other embodiments, the mounting lug 22 may be directly secured to the chassis in fixed relation to the chassis, such as by using a fixed bolt to provide the mounting lug 22.

In operation, a chassis mounting lug 22 is first slidably fitted within rearward slots 26 of opposed drawer slides 12, and then rotated to fit corresponding mounting lugs 22 within respective ones of the intermediate slot 28 and the forward slot 24. One of the mounting lugs 22 engages the cam follower surface portion 36 of the protuberance 34 of the lock member 30 and, by applying weight of a chassis to the cam follower surface 36, moves the lock member 30 from the open position, shown in FIG. 2, to the closed position, shown in FIG. 3. The mounting lug 22 adjacent the forward slot 24 will then fit fully within the forward slot 24, and the bias spring 48 will automatically return the lock member 30 from the open position, with the protuberance 34 disposed aside of the slot 24, to the closed position, with the protuberance 34 disposed adjacent the slot 24 to prevent removal of the associated mounting lug 22 from within the slot 24. With one of the mounting lugs 22 secured in the forward slot 24, the mounting lug 22 disposed in the rearward slot 26 cannot be removed therefrom with the stop 92 defined by the rearward edge 88 of the slot 26 preventing vertical movement of the mounting lug 22 within the slot 26. Removal of a chassis from the drawer slide 12 is initiated by a user manually pressing the grip surface 72 and moving the lock member 30 from being disposed adjacent the forward slot 24 and blocking the mounting lug 22 from removal from within the slot 24, to a position disposed aside of the forward slot 24 and removed from preventing removal of the mounting lug 22 from within the slot 24. The mounting lug 22 may then be removed from within the slot 24 by lifting the forward end of the chassis to rotate the chassis about the mounting lug 22 within the rearward slot 26. Once the respective mounting lug 22 is removed from within the forward slot 24, and the intermediate slot 28, the mounting lug within the rearward slot 26 may then be moved forward and upward to remove the corresponding mounting lug 22 from within the rearward slot 26.

The present invention provides several advantages over prior art chassis locks. A drawer slide is provided with first and second mounting slots, with the second slot configured to extend downward and away from the first slot. An upward edge of the second slot defines a stop to prevent a chassis mounting lug from being moved in a vertical direction from within the second slot. A mounting lug of a chassis is disposed within the second slot, and then another mounting lug is disposed in the first slot. A lineally moveable lock member is slidably mounted to the drawer slide for moving from a closed position, disposed adjacent to the first slot, to an open position, disposed aside of the first slot. The lock member has a protuberant tab which extends with an upper lower side formed to define a cam follower surface and a lower side formed to define a lock surface. The cam follower surface is engaged by a mounting lug moving into the first slot to move the lock member from the closed position to the open position, allowing the chassis mounting lug to pass into the first slot. The weight of the chassis may be applied by the mounting lug to the cam follower surface to move the lock member from the closed position to the open position, which preferably is in a lineal direction extending parallel to the longitudinal axis of the drawer slide. A bias member automatically returns the lock member to the closed position, with the lock surface of the protuberant tab retaining the mounting lug from being removed from within the first slot. The first slot has a vertically extending edge disposed on an opposite side of the first slot from the second slot, which prevents the chassis from moving in a direction from the second slot toward the first slot, such that the mounting lug disposed within the second slot cannot move upwards and toward the first slot to be removed from within the second slot. The lock member may later be moved from the closed position to the open position for removal of the chassis mounting lug from within the first slot, which is adjacent the lock member, to allow the end of the chassis adjacent the first slot to be lifted from being disposed adjacent the vertically extending edge of the first slot. This allows the mounting lug in the second slot to move toward the first slot and upwards, for removal from within the second slot such that the chassis may be removed from the drawer slide.

Although the preferred embodiment has been described in detail, it should be understood that various changes, substitutions and alterations can be made therein without departing from the spirit and scope of the invention as defined by the appended claims.

What is claimed is:

1. In a drawer slide having first slide member and a second slide member, the first slide member being slidably extensible from within the second slide member from a retracted position to an extended position in a cantilevered arrangement, the improvement comprising:
   a chassis mounting lug;
   a first slot formed into the first slide member, said first slot having an entrance section formed into an edge of the first slide member for receiving said chassis mounting lug into said first slot, and a lock section for receiving said chassis mounting lug from said entrance section;
   a lock member slidably mounted to the first slide member for moving along a linear path between an open position and a closed position, said lock member having a main body portion movably secured to the first slide member and a protuberance extending outward from said main body portion, said protuberance having a first side defining a cam follower surface and a second side defining a lock surface;
   a biasing member engaging between the first slide member and said lock member for urging said lock member into said closed position;
   said main body portion and said protuberance adapted such that when said lock member is disposed in said closed position, said lock surface of said protuberance extends adjacent said chassis mounting lug and prevents removal of said chassis mounting lug from said lock section of said first slot, and said cam follower surface extends adjacent to said entrance section of said first slot disposed for engaging said chassis mounting lug when disposed in said entrance section of said first slot, such that movement of said chassis mounting lug from said entrance section into said lock section of said first slot engages said cam follower surface of said protuberance and moves said protuberance and said main body portion of said lock member to one side of said lock section and from said closed position to said open position, against said biasing member; and
   said main body portion and said protuberance adapted such that when said lock member is disposed in said open position, said main body portion and said protuberance are disposed on said one side of said first slot for passing said chassis mounting lug through said entrance section of said first slot, and when said chassis mounting lug is disposed in said lock section of said first slot, said biasing member returns said lock member to said closed position with said lock surface of said protuberance disposed adjacent to said first slot and preventing removal of said chassis mounting lug from within said first slot.

2. The drawer slide according to claim 1, wherein a guide slot is formed into the first slide member and said lock member further comprises a guide tab which extends from said lock member into said guide slot in the first slide member, for guiding said lock member to move along said linear path.

3. The drawer slide according to claim 1, further comprising a fastener secured to the first slide member in a fixed position, and said lock member further comprises an elongate slot formed into said main body portion for receiving said fastener, wherein said elongate slot is configured for slidably securing said lock member to the first slide member for moving between said open position and said closed position along said linear path.

4. The drawer slide according to claim 1, further comprising a second slot formed into the first slide member, spaced apart from said first slot and extending in a downward direction away from said first slot for receiving a second mounting lug and having an edge on a side of said slot opposite said first slot defining a stop to prevent said mounting lug from moving vertically upward when disposed with a second slot lock section.

5. The drawer slide according to claim 4, further comprising a third slot intermediate between said first and second slots, said second slot adapted for receiving a third mounting lug.

6. The drawer slide according to claim 4, further comprising a fastener secured to the first slide member in a fixed position, and said lock member further comprises an elongate slot formed into said main body portion for receiving said fastener, wherein said elongate slot is configured for slidably securing said lock member to the first slide member for moving between said open position and said closed position along said linear path.

7. The drawer slide according to claim 1, further comprising a recess formed into said main body portion of said lock member for receiving said bias member.

8. The drawer slide according to claim 7, wherein said bias member comprises a wound wire coil spring.

9. The drawer slide according to claim 8, wherein said main body portion of said lock member comprises a recessed edge for fitting adjacent to said mounting lug.

10. A drawer slide having first slide member and a second slide member, the first slide member being slidably extensible from within the second slide member from a retracted position to an extended position in a cantilevered arrangement, the improvement comprising:
    a chassis mounting lug;
    a first slot formed into the first slide member, said first slot having an entrance section formed into an edge of the first slide member for receiving said chassis mounting lug into said first slot, and a lock section for receiving said chassis mounting lug from said entrance section;
    a second slot formed into said drawer slide member, spaced apart from said first slot and extending in a downward direction away from said first slot for receiving a second mounting lug and having an edge on a side of said slot opposite said first slot defining a stop to prevent said mounting lug from moving vertically upward when disposed with a second slot lock section;

a lock member slidably mounted to the first slide member for moving along a linear path between an open position and a closed position, said lock member having a main body portion movably secured to the first slide member and a protuberance extending outward from said main body portion, said protuberance having a first, upwardly extending side defining a cam follower surface and a second, downwardly facing side defining a lock surface;

a biasing member engaging between the first slide member and said lock member for urging said lock member into said closed position;

said main body portion and said protuberance adapted such that when said lock member is disposed in said closed position, said lock surface of said protuberance extends adjacent said chassis mounting lug and prevents removal of said chassis mounting lug from said lock section of said first slot, and said cam follower surface extends adjacent to said entrance section of said first slot disposed for engaging said chassis mounting lug when disposed in said entrance section of said first slot, such that movement of said chassis mounting lug from said entrance section into said lock section of said first slot engages said cam follower surface of said protuberance and moves said protuberance and said main body portion of said lock member to one side of said lock section and from said closed position to said open position, against said biasing member; and said main body portion and said protuberance adapted such that when said lock member is disposed in said open position, said main body portion and said protuberance are disposed on said one side of said first slot for passing said chassis mounting lug through said entrance section of said first slot, and when said chassis mounting lug is disposed in said lock section of said first slot, said biasing member returns said lock member to said closed position with said lock surface of said protuberance disposed adjacent to said first slot and preventing removal of said chassis mounting lug from within said first slot.

11. The drawer slide according to claim 10, wherein a guide slot is formed into the first slide member and said lock member further comprises a guide tab which extends from said lock member into said guide slot in the first slide member, for guiding said lock member to move along said linear path.

12. The drawer slide according to claim 10, further comprising a fastener secured to the first slide member in a fixed position, and said lock member further comprises an elongate slot formed into said main body portion for receiving said fastener, wherein said elongate slot is configured for slidably securing said lock member to the first slide member for moving between said open position and said closed position along said linear path.

13. The drawer slide according to claim 12, further comprising a third slot intermediate between said first and second slots, said second slot adapted for receiving a third mounting lug.

14. The drawer slide according to claim 10, wherein said main body portion of said lock member comprises a recess formed into said main body portion of said lock member for receiving said bias member and a recessed edge for fitting adjacent to said mounting lug.

15. The drawer slide according to claim 10, wherein said first slot extends along a substantially vertical axis and said second slot extends along an axis at an angle to vertical.

16. A drawer slide having first slide member and a second slide member, the first slide member being slidably extensible from within the second slide member from a retracted position to an extended position in a cantilevered arrangement, the improvement comprising:

a chassis mounting lug;

a first slot formed into the first slide member to extend along a substantially vertical axis, said first slot having an entrance section formed into an edge of the first slide member for receiving said chassis mounting lug into said first slot, and a lock section for receiving said chassis mounting lug from said entrance section;

a second slot formed into said first slide member along an axis which is disposed at an angle to vertical, spaced apart from said first slot and extending in a downward direction away from said first slot for receiving a second mounting lug and having an edge on a side of said slot opposite said first slot defining a stop to prevent said mounting lug from moving vertically upward when disposed with a second slot lock section;

a lock member slidably mounted to the first slide member for moving along a horizontal path between an open position and a closed position, said lock member having a main body portion movably secured to the first slide member and a protuberance extending from said main body portion, said protuberance having a first side defining a cam follower surface and a second side defining a lock surface;

a biasing member engaging between the first slide member and said lock member for urging said lock member into said closed position;

a fastener secured to the first slide member in a fixed position, and said lock member further comprises an elongate slot formed into said main body portion for receiving said fastener, wherein said elongate slot is configured for slidably securing said lock member to the first slide member for moving between said open position and said closed position along said linear path;

said main body portion and said protuberance adapted such that when said lock member is disposed in said closed position, said lock surface of said protuberance extends adjacent said chassis mounting lug and prevents removal of said chassis mounting lug from said lock section of said first slot, and said cam follower surface extends adjacent to said entrance section of said first slot disposed for engaging said chassis mounting lug when disposed in said entrance section of said first slot, such that movement of said chassis mounting lug from said entrance section into said lock section of said first slot engages said cam follower surface of said protuberance and moves said lock member from said closed position to said open position, against said biasing member; and said main body portion and said protuberance adapted such that when said lock member is disposed in said open position, said protuberance is moved aside of said first slot for passing said chassis mounting lug through said entrance section of said first slot, and when said chassis mounting lug is disposed in said lock section of said first slot, said biasing member returns said lock member to said closed position with said lock surface of said protuberance disposed adjacent to said first slot and preventing removal of said chassis mounting lug from within said first slot.

17. The drawer slide according to claim 16, wherein a guide slot is formed into the first slide member and said lock member further comprises an elongate guide tab which extends from said lock member into said guide slot in the first slide member, for guiding said lock member to move along said linear path.

18. The drawer slide according to claim 17, wherein said main body portion of said lock member comprises a recessed edge for fitting adjacent to said mounting lug.

19. The drawer slide according to claim 18, further comprising a third slot intermediate between said first and second slots, said second slot adapted for receiving a third mounting lug.

20. The drawer slide according to claim 19, further comprising a recess formed into said main body portion of said lock member for receiving said bias member.

* * * * *